(12) United States Patent
Fievet

(10) Patent No.: US 7,729,553 B2
(45) Date of Patent: Jun. 1, 2010

(54) VECTOR QUANTIZER BASED ON N-DIMENSIONAL SPATIAL DICHOTOMY

(75) Inventor: Sebastien Fievet, Aix en Provence (FR)

(73) Assignee: Atmel Corporation, San Jose, CA (US)

( * ) Notice: Subject to any disclaimer, the term of this patent is extended or adjusted under 35 U.S.C. 154(b) by 1106 days.

(21) Appl. No.: 11/339,123

(22) Filed: Jan. 25, 2006

(65) Prior Publication Data

US 2007/0122048 A1 May 31, 2007

(30) Foreign Application Priority Data

Nov. 16, 2005 (FR) .................................. 05 11609

(51) Int. Cl.
*G06K 9/36* (2006.01)
*G06K 9/38* (2006.01)
*G06K 9/46* (2006.01)
*H03M 7/00* (2006.01)

(52) U.S. Cl. ........................................ 382/253; 341/79
(58) Field of Classification Search ................ 382/253; 341/79

See application file for complete search history.

(56) References Cited

U.S. PATENT DOCUMENTS

| 4,558,350 | A |   | 12/1985 | Murakami et al. |
|---|---|---|---|---|
| 4,670,851 | A |   | 6/1987 | Murakami et al. |
| 4,727,354 | A | * | 2/1988 | Lindsay ..................... 341/106 |
| 4,837,632 | A | * | 6/1989 | Kubo et al. .............. 348/208.6 |
| 4,958,225 | A |   | 9/1990 | Bi et al. |
| 5,010,574 | A |   | 4/1991 | Wang |
| 5,636,322 | A |   | 6/1997 | Ono |
| 5,721,791 | A | * | 2/1998 | Maeda et al. ................ 382/253 |
| 5,978,758 | A |   | 11/1999 | Ono |
| 6,345,126 | B1 |   | 2/2002 | Vishwanath et al. |
| 6,349,152 | B1 | * | 2/2002 | Chaddha ..................... 382/253 |
| 6,384,761 | B1 |   | 5/2002 | Melanson |
| 6,438,268 | B1 | * | 8/2002 | Cockshott et al. ........... 382/253 |
| 6,473,017 | B1 |   | 10/2002 | Nguyen |
| 6,671,416 | B2 |   | 12/2003 | Vishwanath et al. |

FOREIGN PATENT DOCUMENTS

WO WO-2007/058809 A2 5/2007

OTHER PUBLICATIONS

Cosman et al. "Vector quantization of image subbands: a survey", IEEE Transactions on Image Processing, 1996, vol. 5, Issue: 2, pp. 202-225.*
Patane et al. "Fully automatic clustering system", IEEE Transactions on Neural Networks, Nov. 2002, vol. 13, Issue: 6, pp. 1285-1298.*
PCT Application No. PCT/US2006/043197, International Search Report mailed Oct. 17, 2007, 1 pg.
Han, Jong-Ki, et al., "A Differential Index Assignment Scheme for Tree-Structured Vector Quantization", *IEEE Transactions on Medical Imaging*, 18(5), (May 1999), 442-447.

* cited by examiner

*Primary Examiner*—Samir A. Ahmed
*Assistant Examiner*—Li Liu
(74) *Attorney, Agent, or Firm*—Schwegman, Lundberg & Woessner, P.A.

(57) ABSTRACT

A method and system for quantizing a vector corresponding to an input signal is described. The vector has a plurality of components corresponding to an N-dimensional space. In one aspect, the method and system include recursively dividing the space into equal spaces having one dimension less than a previous recursion until end spaces are formed. Each end space is two-dimensional. The method and system also include asynchronously comparing the components in each end space to determine a sub-space of a particular end space having a closest match to the vector. In another aspect, the method and system include providing tree(s) including a plurality of nodes and asynchronously traversing the tree(s) to determine a closest match to the vector. The nodes correspond to ANDs of comparisons between the components. Each comparison determines whether a first component is greater than a second component.

7 Claims, 4 Drawing Sheets

VECTOR QUANTIZER BASED ON N-DIMENSIONAL SPATIAL DICHOTOMY

CROSS-REFERENCE TO RELATED APPLICATIONS

This application claims benefit under 35 USC 119 of France patent application 0511609, filed on Nov. 16, 2005.

FIELD OF THE INVENTION

The present invention relates to data conversion, and more particularly to a method and system for performing asynchronous vector quantization, for example in dynamic element matching.

BACKGROUND OF THE INVENTION

Digital to analog converters (DACs) and analog to digital converters (ADCs) are used in a variety of applications. In performing the conversion, the DAC/ADC typically uses techniques such as $\Delta\Sigma$ conversion to find a closest match to the input signal and convert errors to out-of-signal band noise. The requirements of such DACs/ADCs may be quite stringent for certain applications. For example, DACs and ADCs may be used in modern audio systems. For such applications, the targeted performance may be a signal-to-noise ratio (SNR) of sixteen bits, or higher in certain bandwidths such as the 20 kHz audio bandwidth. Similar technologies, for example, third generation cellular phone and voice over Internet protocol (VOIP) audio conferencing phones, also require high performance audio coder/decoders (CODECs) that are low in cost but which do not unduly sacrifice performance. Although DACs and ADCs are known, conventional used in converting errors, such as data weighted averaging, may not be adequate for certain applications or may be expensive to implement. Consequently, a mechanism for providing low cost, high-performance data converters is desired.

Dynamic element matching (DEM) is a technique that may be used in converting mismatch errors into out-of-signal band noise for ADCs/DACs. Implementing DEM might be relatively low in cost because DEM does not require highly accurate calibration systems. In order to perform DEM, vector quantization is used. Vector quantization is a mathematical technique that may be used to shape the analog mismatch noise out of the signal band, allowing the DAC/ADC to perform its function. In particular, vector quantization determines a closest match to a particular vector. In an implementation of an ADC/DAC using DEM, vector quantization might be used to determine how to switch the DAC/ADC elements, such as capacitors and current sources, to find the closest match to an input signal.

To more readily understand vector quantization, refer to FIG. 1, which is a diagram 10 depicting three-dimensional vector quantization. The vector U 12 corresponds to the input signal. Thus, U 12 corresponds to a sample of the input signal. Mathematically, vector quantization determines the vector that is closest match to the vector U 12 and that has unit vector components in each dimension. Stated differently, for the three-dimensional case depicted in FIG. 1, vector quantization would determine the projection of the vector U 12 onto the closest vector defined by the origin (0,0,0) and the vertices of the cube 14. Consequently, the output of the vector quantization would be a vector that is zero or is from the origin (0,0,0) to one of the vertices (1,0,0), (0,1,0), (0,0,1), (1,1,0), (0,1,1), or (1,1,1). The closest match between U 12 and the output, V, occurs when $\|U-V\|$ is minimized. This quantity is minimized when the scalar product of U 12 and V is maximized, which corresponds to U 12 being aligned with V. Aligning U 12 and V thus corresponds to identifying the largest elements of the U 12. Thus, using mathematical techniques, vector quantization may find the closest match to U 12 as well as the error.

In applications of vector quantization, the number of spatial dimensions corresponds to the desired resolution. The desired resolution, R, is given by the desired number of bits in the resolution. The number, N, of spatial dimensions of the vector U corresponding to the input signal is greater than or equal to $2^R-1$. Thus, for a two bit resolution, the number of spatial dimensions is three. Consequently, the cube 14 depicted in FIG. 1 might be used in performing vector quantization for applications having a three bit resolution requirement. For four-bit resolution, the number of spatial dimensions is 15. For higher resolution, the number of dimensions scales exponentially.

Although DEM may be lower in cost to implement, there are currently barriers to its use in conventional DACs/ADCs. In particular, implementing vector quantization may have undesirable results. Signals are desired to have n-bit resolution (an n-bit signal), for example in N-bit $\Delta\Sigma$ conversion. In such a conversion, the corresponding vector has N dimensions (corresponding to $2^n-1$, as discussed above). Stated differently, vector quantization would take place in N dimensions, where N is $2^n-1$. The conventional vector quantizer would, therefore, sort approximately $2^n$ elements for each input data sample. This sorting operation typically requires a clock that runs $2^n$ times faster than the sampling clock used in obtaining the data sample. Such a clock would be very high frequency, which would be undesirable. Furthermore, the DAC/ADC would include at least two clocks, the sampling clock and the clock used in sorting. Consequently, the DAC/ADC would also be a mixed mode environment. Use of a high frequency clock in a mixed mode environment is also undesirable.

Accordingly, what is needed is a mechanism for aiding in providing high speed, low cost converters. The present invention addresses such a need.

BRIEF SUMMARY OF THE INVENTION

The present invention provides a method and system for quantizing a vector corresponding to an input signal. The vector has a plurality of components corresponding to an N-dimensional space. In one aspect, the method and system comprise recursively dividing the space into equal spaces having one dimension less than a previous recursion until end spaces are formed. Each of the end spaces is two-dimensional. In this aspect, the method and system also comprise asynchronously comparing the plurality of components in each of the plurality of end spaces to determine subspace of a sub-space of a particular end space of the plurality of end spaces having a closest match to the vector. In another aspect, the method and system comprise providing at least one tree including a plurality of nodes and asynchronously traversing the tree to determine a closest match to the vector. The plurality of nodes corresponds to a plurality of ANDs of a plurality of comparisons between each of the plurality of components. Each of the plurality of comparisons determines whether a first component of the plurality of components is greater than a second component of the plurality of components.

According to the method and system disclosed herein, the present invention provides a method and system for performing asynchronous vector quantization.

DETAILED DESCRIPTION OF THE INVENTION

The present invention relates to vector quantization. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for quantizing a vector corresponding to an input signal. The vector has a plurality of components corresponding to an N-dimensional space. In one aspect, the method and system comprise recursively dividing the space into equal spaces having one dimension less than a previous recursion until end spaces are formed. Each of the end spaces is two-dimensional. In this aspect, the method and system also comprise asynchronously comparing a pair of components of the plurality of components for each of the plurality of end spaces to determine subspace of a sub-space of a particular end space of the plurality of end spaces having a closest match to the vector. In another aspect, the method and system comprise providing at least one tree including a plurality of nodes and asynchronously traversing the tree to determine a closest match to the vector. The plurality of nodes corresponds to a plurality of ANDs of a plurality of comparisons between each of the plurality of components. Each of the plurality of comparisons determines whether a first component of the plurality of components is greater than a second component of the plurality of components.

The present invention will be described in terms of particular vectors, particular dimensions, and particular applications, such as ADCs. However, one of ordinary skill in the art will readily recognize that the method and system operate effectively for other vectors, other dimensions, and other applications.

Figure 1:
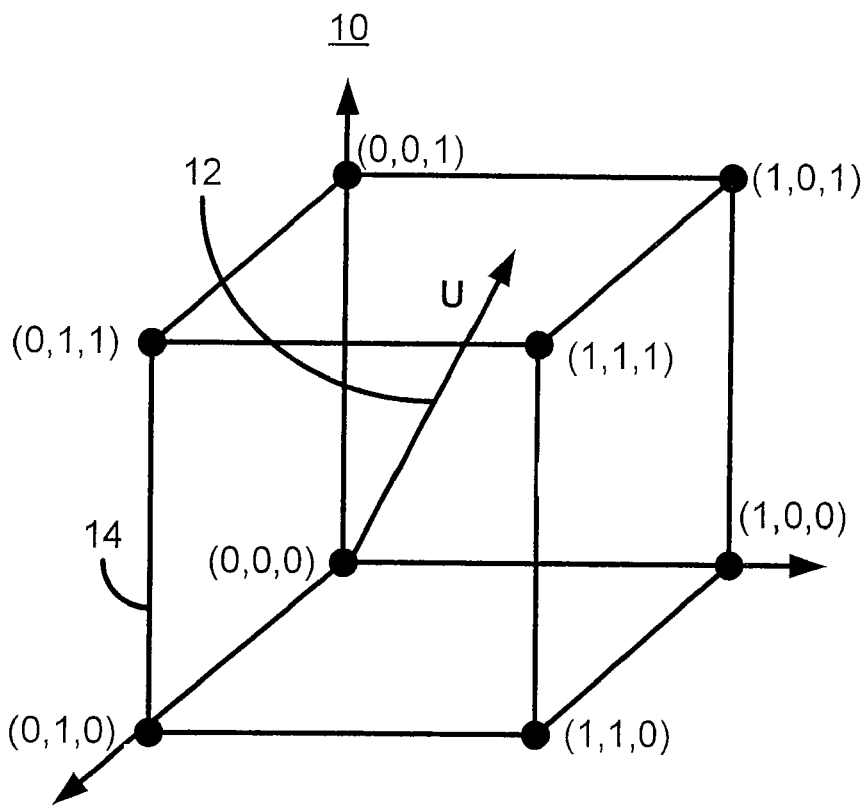
FIG. 1 is a diagram depicting three-dimensional vector quantization.
Figure 2:
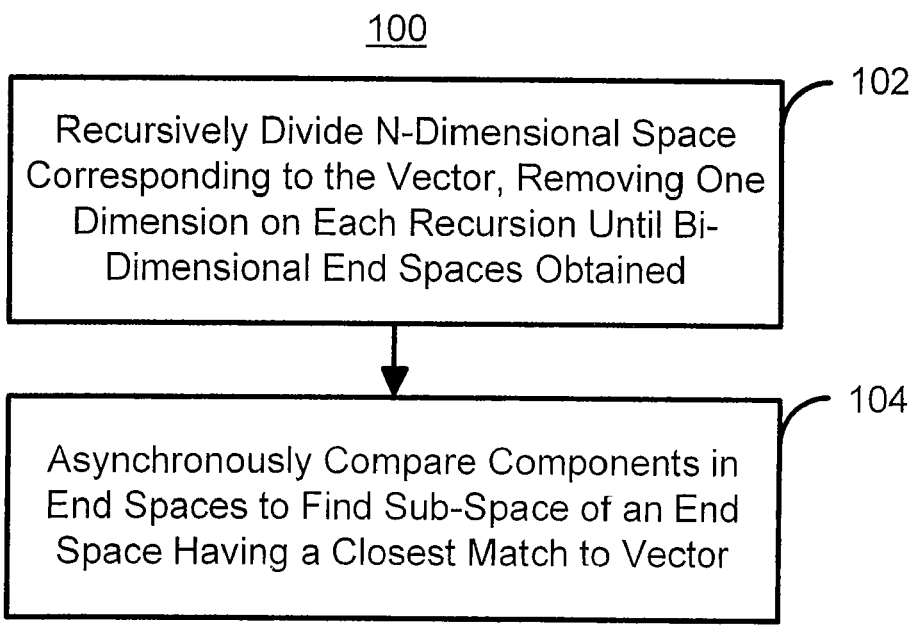
FIG. 2 is a flow chart depicting one embodiment of a method in accordance with the present invention for performing vector quantization.

FIG. 2 is a flow chart depicting one embodiment of a method 100 in accordance with the present invention for performing vector quantization. The method 100 is used to quantize a vector, such as the vector U 12, that corresponds to an input signal. Thus, the vector resides in an n-dimensional space and has a plurality of components (i.e. n components) in the n-dimensional space. Although the vector has n components, one or more of the components may be zero. The input signal is also often a scalar signal. Consequently, the vector that is being quantized is generally the resultant of a scalar to vector transformation.

The n-dimensional space is recursively divided into a plurality of equal spaces having one dimension less than a previous recursion until end spaces are formed, via step 102. Each of the end spaces is two-dimensional. Thus, in step 102 the n-dimensional space is first divided into n spaces having dimension (n−1). This process continues, increasing the number of spaces and decreasing the dimension of each of the spaces until the bi-dimensional end spaces are obtained.

The components of the vector in the end spaces are then asynchronously compared to one another to determine a sub-space of a particular end space that has a closest match to the vector, via step 104. Step 104 utilizes spatial dichotomy to identifying the sub-space which most closely matches the vector corresponding to the input signal. Stated differently, step 104 compares the components of the vector in each end space to determine the largest, which corresponds to the sub-space which most closely matches the vector. Because the end spaces are bi-dimensional, the sub-space has dimension 1 and is corresponds to the vector that most closely matches the vector. Consequently, by identifying the sub-space via spatial dichotomy, the vector corresponding to the input signal is quantized.

Thus, using the method 100, the vector corresponding to the input signal may be asynchronously quantized. Because the comparison in step 104 is performed asynchronously, no high frequency clock may be required to perform the vector quantization. Thus, a high frequency, mixed mode environment may be avoided. Furthermore, because vector quantization can be asynchronously performed on the vector corresponding to the input signal, DEM may be used in conversion applications. Consequently, the method 100 facilitates the use of low cost, high speed converters, such as audio/voice converters.

Figure 3:
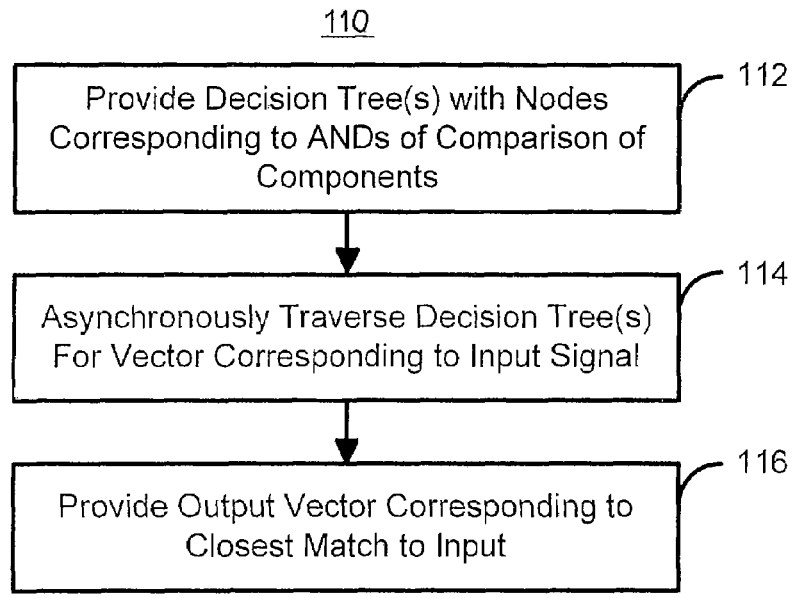
FIG. 3 is a flow chart depicting another embodiment of a method in accordance with the present invention for performing vector quantization.
Figure 4:
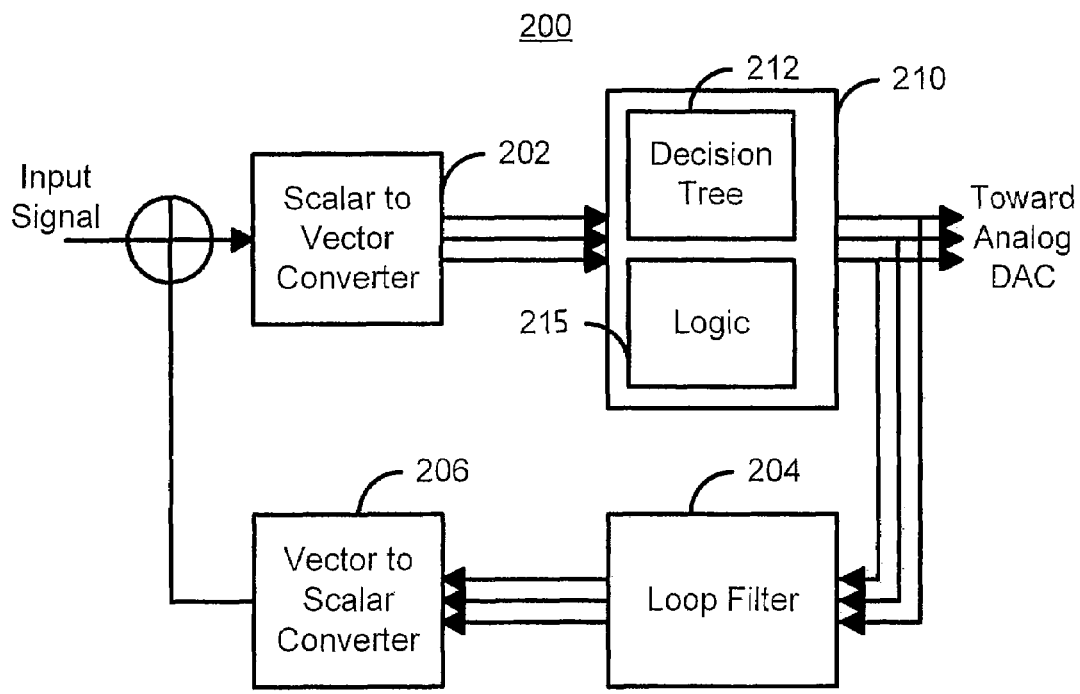
FIG. 4 is a diagram of one embodiment of a mismatch shaping engine in accordance with the present invention.

FIG. 3 is a flow chart depicting another embodiment of a method 110 in accordance with the present invention for performing vector quantization. FIG. 4 is a diagram of one embodiment of a mismatch shaping engine 200 in accordance with the present invention. Referring to FIGS. 3-4, the method 100 is described in the context of the mismatch shaping engine 200. The mismatch shaping engine 200 includes a scalar to vector converter 202, a vector quantizer 210, a loop filter 204, and a vector to scalar converter 206. The vector quantizer includes at least one decision tree 212, described below, and logic 215. In a preferred embodiment, the mismatch shaping engine 200 shown is part of a $\Delta\Sigma$ converter, as depicted in FIG. 4. However, nothing prevents the mismatch shaping engine from being part of another component.

The method 110 is used to quantize a vector, such as the vector U 12, that corresponds to an input signal. Thus, the vector resides in an N-dimensional space and has a plurality of components (i.e. N components) in the N-dimensional space. Although the vector has N components, one or more of the components may have a magnitude of zero. The input signal is also often a scalar signal. Consequently, the vector that is being quantized is generally the resultant of a scalar to vector transformation, typically performed using the scalar to vector converter 202.

At least one tree including a plurality of nodes is provided, via step 112. The tree(s) provided in step 112 is preferably the tree 212. The nodes correspond to ANDs comparisons the components of the vector. The comparisons can be represented by $C_k$ and $barC_k$. The term $C_k$ is given as follows: $C_k = u_i > u_j$ where k= an integer from 0 to N(N−1)/2−1, i and j=integers from 0 to N−1 and i is not equal j. Similarly $barC_k = u_i < u_j$. Thus, each comparison, $C_k$ or $barC_k$, determines whether one component is greater than a particular other component.

Figure 5:
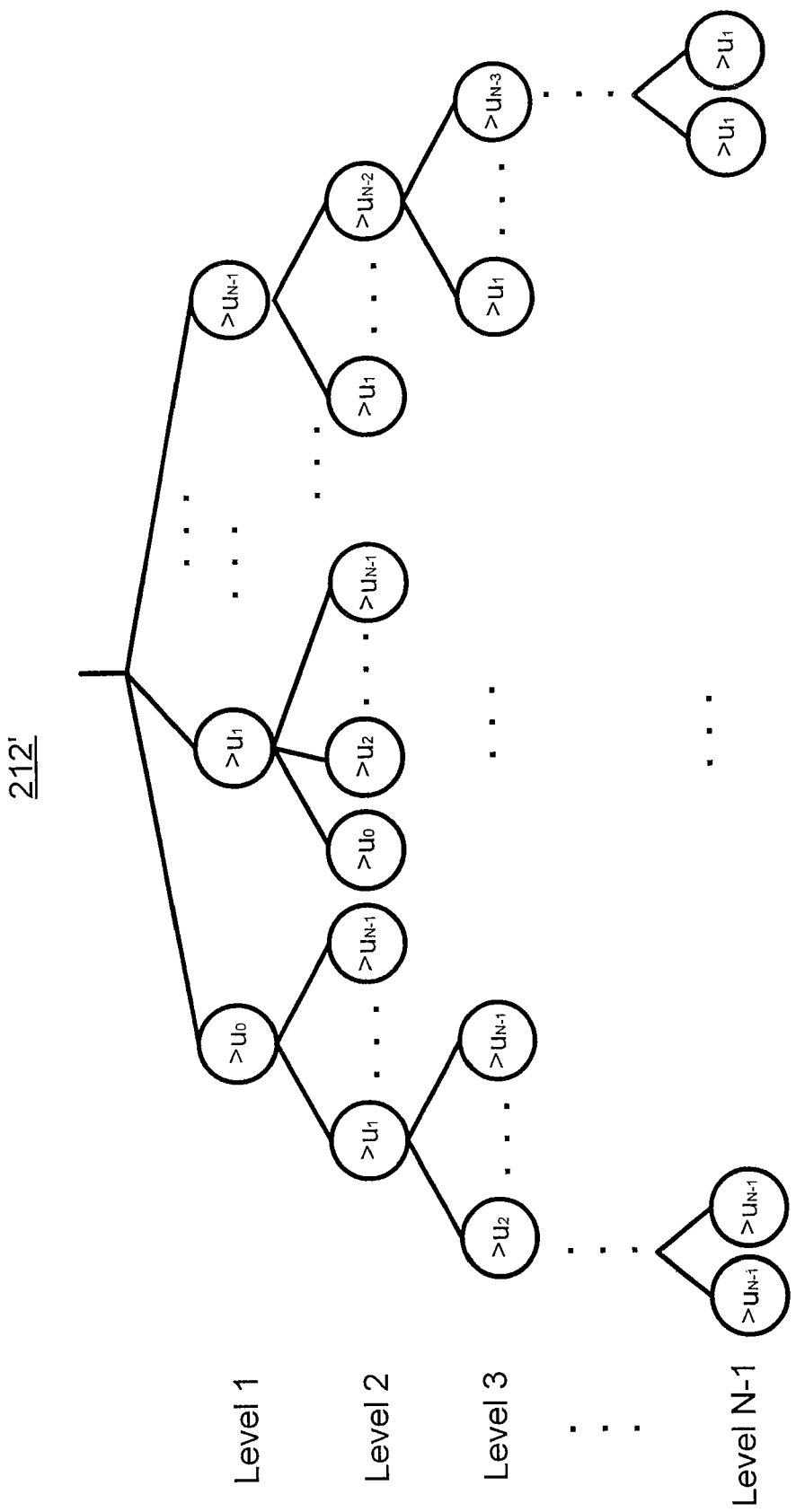
FIG. 5 is a diagram depicting one embodiment of a decision tree in accordance with the present invention.

In one embodiment, step 112 provides a single decision tree. FIG. 5 is a diagram depicting one embodiment of such a decision tree 212' in accordance with the present invention. Referring to FIGS. 3-5, the decision tree 212' corresponds to the decision tree 212 in the mismatch shaping engine 200 and is formed using one embodiment of the step 112. The tree 212' provided in step 112 contains comparisons of all of the components of the vector being quantized. Thus, at each node n at a level, x, the comparison would be given by: $gtu_{x-1}[n] = AND(C_k, barC_k)$. Thus, as depicted in FIG. 5, each $>u_i$ corresponds to a comparison that the component is greater than $u_i$. Stated differently, as the tree is traversed, a particular node is reached by performing AND operations for the comparisons in the previous node. The tree 212' has a depth (total number of levels) of N−1.

Figure 6:
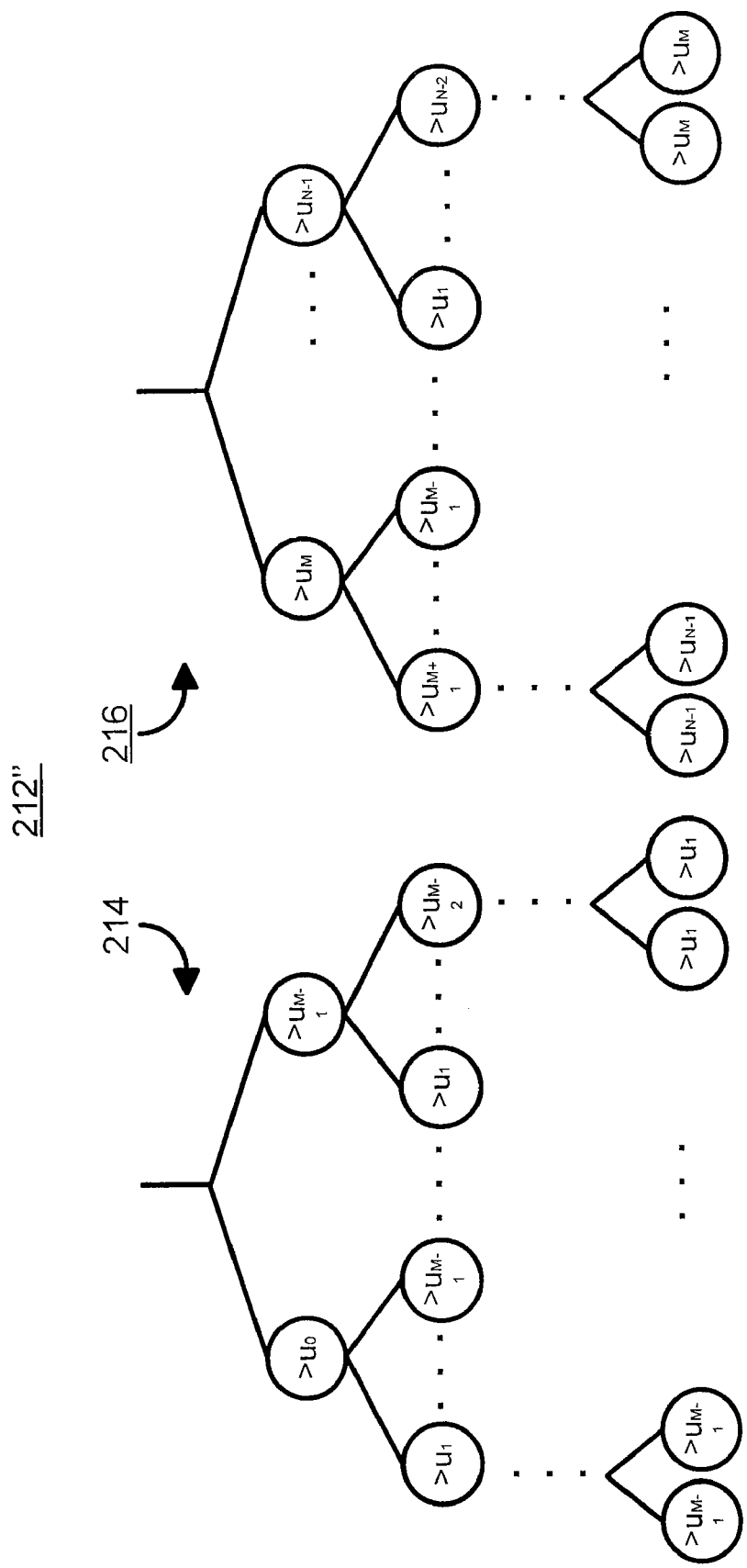
FIG. 6 is a diagram depicting one embodiment of a decision tree pair in accordance with the present invention.

In another embodiment, step 112 provides a tree that includes a plurality of sub-trees. In such an embodiment, a pair of sub-trees is preferably provided. FIG. 6 is a diagram depicting one embodiment of a decision tree pair 212" in accordance with the present invention. Each of the sub-trees 214 and 216 is used in searching a portion of the components of the vector. Preferably, a first sub-tree 214 searches the M greatest components to determine which component is greater. In such a sub-tree 214, the nodes would have the form gtu.sub.x−1[n]. Also in a preferred embodiment, a second sub-tree 214 of the pair searches a second portion of the plurality of components. These components preferably include the N-M smallest components and are searched to determine the smallest components. For such a tree 212" having two sub-trees 214 and 216, the n at a level, x, the comparison would be given by: $gtu_{x-1}[n] = AND(C_k, barC_k)$ or $ltu_{x-1}[n] = AND(C_k, barC_k)$.

Once the trees are configured, the tree(s) 212/212'/212" are asynchronously traversed the at least one tree to determine the closest match to the vector being quantized, via step 114. Thus, a path through some portion of the nodes in tree(s) 212/212'/212" is followed asynchronously, and the closest match determined.

An output vector is provided, via step 116. In one embodiment, the output vector, V, had components V[i] given by $V[i] = OR(ltu_k)$, where i=an integer from zero to (N−1)/2−1 and k=is an integer from zero to x−1, where x is the level in the tree, or $V[i] = OR(gtu_k)$, where i=an integer from (N−1)/2 to N−1 and k=is an integer from zero to x−1.

For example, assume the method 110 and mismatch shaping engine 200 are used in a four element converter, which corresponds to four-dimensional vector quantization. Suppose the vector corresponding to the input signal, U, has components $u_0$, $u_1$, $u_2$, and $u_3$ in the four dimensions. The comparisons are given by: $C_0 = u_1 > u_0$, $C_1 = u_2 > u_0$, $C_2 = u_3 > u_0$, $C_3 = u_2 > u_1$, $C_4 = u_3 > u_1$, $C_5 = u_3 > u_2$, $barC_0 = u_0 > u_1$, $barC_1 = u_0 > u_2$, $barC_2 = u_0 > u_3$, $barC_3 = u_1 > u_2$, $barC_4 = u_1 > u_3$, $barC_5 = u_2 > u_3$. The terms in the corresponding tree(s) 212/212'/212" are given by the appropriate $gtu_0$ and $ltu_0$ terms described above. For the first level of the trees 212", the nodes are:

| | |
|---|---|
| $gtu_0[0] = C_0.C_1.C_2$ | $ltu_0[0] = barC_0.barC_1.barC_2$ |
| $gtu_0[1] = barC_0.C_3.C_4$ | $ltu_0[1] = C_0.barC_3.barC_4$ |
| $gtu_0[2] = barC_1.barC_3.C_5$ | $ltu_0[2] = C_1.C_3.barC_5$ |
| $gtu_0[3] = barC_2.barC_4.barC_5$ | $ltu_0[3] = C_2.C_4.C_5$ |

The nodes at the second level of the tree 212" are given by:

| | |
|---|---|
| $gtu_1[0] = C_3.C_4$ | $ltu_1[0] = barC_3.barC_4$ |
| $gtu_1[1] = barC_3.C_5$ | $ltu_1[1] = C_3.barC_5$ |
| $gtu_1[2] = barC_4.barC_5$ | $ltu_1[2] = C_4.C_5$ |
| $gtu_1[3] = C_1.C_2$ | $ltu_1[3] = barC_1.barC_2$ |
| $gtu_1[4] = barC_1.C_5$ | $ltu_1[4] = C_1.barC_5$ |
| $gtu_1[5] = barC_2.barC_5$ | $ltu_1[5] = C_2.C_5$ |
| $gtu_1[6] = C_0.C_2$ | $ltu_1[6] = barC_0.barC_2$ |
| $gtu_1[7] = barC_0.C_4$ | $ltu_1[7] = C_0.barC_4$ |
| $gtu_1[8] = barC_2.barC_4$ | $ltu_1[8] = C_2.C_4$ |
| $gtu_1[9] = C_0.C_1$ | $ltu_1[9] = barC_0.barC_1$ |
| $gtu_1[10] = barC_0.C_3$ | $ltu_1[10] = C_0.barC_3$ |
| $gtu_1[11] = barC_1.barC_3$ | $ltu_1[11] = C_1.C_3$ |

Consequently, the can be given as a function of the level x. Thus, the components, v[0], v[1], v[2], v[3] of the output vector V are given by:

| For x = 1 | if x = 2 | if x = 3 |
|---|---|---|
| $v[0] = ltu_0[0]$ | $v[0] = ltu_0[0] + ltu_1[3] + ltu_1[6] + ltu_1[9]$ | $v[0] = bar(gtu_0[0])$ |
| $v[1] = ltu_0[1]$ | $v[1] = ltu_0[1] + ltu_1[0] + ltu_1[7] + ltu_1[10]$ | $v[1] = bar(gtu_0[1])$ |
| $v[2] = ltu_0[2]$ | $v[2] = ltu_0[2] + ltu_1[1] + ltu_1[4] + ltu_1[11]$ | $v[2] = bar(gtu_0[2])$ |
| $v[3] = ltu_0[3]$ | $v[3] = ltu_0[3] + ltu_1[2] + ltu_1[5] + ltu_1[8]$ | $v[3] = bar(gtu_0[3])$ |

Thus, using the method 110 and the mismatch shaping engine 200, the vector corresponding to the input signal may be asynchronously quantized. Because the tree(s) 212/212'/212" are traversed asynchronously, no high frequency clock may be required to perform the vector quantization. Thus, a high frequency, mixed mode environment may be avoided. Consequently, analog circuits need not be disturbed by a high frequency clock. Moreover, in high speed applications, a decision on the tree 212/212'/212" may be performed every clock cycle. Furthermore, because of the use of the tree 212/212'/212", the mismatch shaping engine 200 and methods 100 and 110 may be scaled for different numbers of elements and different resolutions. For example, an eight element ΔΣ DAC may be provided using the mismatch shaping engine 200 and method 100 or 200. Consequently, the methods 100 and 110 and the mismatch shaping engine 200 facilitate low cost, high speed converters, such as audio/voice converters.

A method and system for performing vector quantization for an input signal, for example in voice/audio and other converters, has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

I claim:

1. A system for quantizing a vector corresponding to an input signal, the vector having a plurality of components corresponding to an N-dimensional space, the system comprising:

a first part of at least one of a digital to analog converter (DAC) circuit and an analog to digital converter (ADC) circuit, the first part including at least one tree including a plurality of nodes, the plurality of nodes corresponding to a plurality of ANDs of a plurality of comparisons between the plurality of components, each comparison of the plurality of comparisons determining whether a first component of the plurality of components is greater than a second component of the plurality of components; and a second part of one of the DAC circuit and the ADC circuit, the second part including logic for asynchronously traversing the at least one tree to determine a closest match to the vector.

2. The system of claim 1 wherein the plurality of components includes N components, wherein a comparison of the plurality of comparisons is $C_k = u_i > u_j$ where k=an integer from 0 to N(N−1)/2, i and j=integers from 0 to N−1 and i is not equal j; and $\mathrm{bar}C_k = u_i < u_j$.

3. The system of claim 2 wherein the at least one tree further includes:

a plurality of sub-trees, a first portion of the plurality of sub-trees searching a first portion of the plurality of components including an M greatest of the plurality of components, a second portion of the plurality of sub-trees searching a second portion of the plurality of components including an N−M smallest of the plurality of components.

4. The system of claim 3 wherein each of a portion of the plurality of nodes corresponding to the first portion of the plurality of sub-trees includes a comparison for node n, $\mathrm{gtu}_{x-1}[n] = \mathrm{AND}(C_k, \mathrm{bar}C_k)$.

5. The system of claim 4 wherein each of a portion of the plurality of nodes corresponding to the second portion of the plurality of sub-trees includes a comparison for node n, $\mathrm{ltu}_{x-1}[n] = \mathrm{AND}(C_k, \mathrm{bar}C_k)$.

6. The system of claim 5 wherein the system further provides an output vector having components $V[i] = \mathrm{OR}(\mathrm{ltu}_k)$, where i=an integer from zero to (N−1)/2−1 and k=an integer from zero to x−1 and $V[i] = \mathrm{OR}(\mathrm{gtu}_k)$, where i=an integer from (N−1)/2 to N−1 and k=an integer from zero to x−1, where x is a level of the at least one tree.

7. A mismatch shaping engine comprising:

a first part of at least one of a digital to analog converter (DAC) circuit and an analog to digital converter (ADC) circuit, the first part including a scalar to vector converter;

a second part of one of the DAC circuit and the ADC circuit, the second part including a vector quantizer coupled with the scalar to vector converter, the vector quantizer including at least one tree and logic, the at least one tree including a plurality of nodes, the plurality of nodes corresponding to a plurality of ANDs of a plurality of comparisons between the plurality of components, each comparison of the plurality of comparisons determining whether a first component of the plurality of components is greater than a second component of the plurality of components, the logic for asynchronously traversing the at least one tree to determine a closest match to the vector;

a third part of one of the DAC circuit and the ADC circuit, the third part including a loop filter coupled with the vector quantizer; and a fourth part of one of the DAC circuit and the ADC circuit, the fourth part including a vector to scalar converter coupled with the loop filter.

* * * * *